United States Patent
Park

(10) Patent No.: US 7,639,010 B2
(45) Date of Patent: Dec. 29, 2009

(54) TURBOSPIN ECHO IMAGING SEQUENCE WITH LONG ECHO TRAINS AND OPTIMIZED T1 CONTRAST

(75) Inventor: Jaeseok Park, Seoul (KR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/117,340

(22) Filed: May 8, 2008

(65) Prior Publication Data

US 2008/0278159 A1    Nov. 13, 2008

(30) Foreign Application Priority Data

May 9, 2007    (DE)    ................. 10 2007 021 719

(51) Int. Cl.
*G01V 3/00*    (2006.01)

(52) U.S. Cl. ....................... 324/309; 324/307

(58) Field of Classification Search ................. 324/309, 324/307
See application file for complete search history.

(56) References Cited

U.S. PATENT DOCUMENTS

| | | | |
|---|---|---|---|
| 5,245,282 A | 9/1993 | Mugler, III et al. | |
| 5,429,134 A | 7/1995 | Foo | |
| 5,432,448 A * | 7/1995 | Heid et al. | ................ 324/309 |
| 5,545,992 A | 8/1996 | Foo | |
| 7,164,268 B2 * | 1/2007 | Mugler et al. | ................ 324/307 |
| 7,176,687 B2 * | 2/2007 | Jenniskens et al. | ........... 324/309 |
| 7,323,871 B2 * | 1/2008 | Foo | ................ 324/307 |
| 2004/0051527 A1 | 3/2004 | Mugler, III et al. | |
| 2005/0174114 A1 | 8/2005 | Mugler, III et al. | |

OTHER PUBLICATIONS

"Multiecho Sequences with Variable Refocusing Flip Angles: Optimization of Signal Behavior Using Smooth Transitions Between Pseudo Steady States (TRAPS)," Hennig et al., Magnetic Resonance in Medicine, vol. 49 (2003), pp. 527-538.
"Optimized Single-Slab Three-Dimensional Spin-Echo MR Imaging of the Brain," Mugler, III et al., Radiology, vol. 216 (2000), pp. 891-899.
"Three-Dimensional Spin-Echo-Train Proton-Density-Weighted Imaging Using Shaped Signal Evolutions," Mugler, III et al., ISMRM (1999), p. 1631.
"Bilgebende Systeme für die medizinische Diagnostik," Morneburg (1995) pp. 548-553.

* cited by examiner

*Primary Examiner*—Louis M Arana
(74) *Attorney, Agent, or Firm*—Schiff Hardin LLP

(57) ABSTRACT

In a method in the form of a turbo spin echo imaging sequence with long echo trains and optimized T1 contrast for generation of T1-weighted images of an examination subject by magnetic resonance, magnetization in the examination subject is excited with an RF excitation pulse, a number N of RF refocusing pulses with variable flip angle are radiated to generate multiple spin echoes for an excitation pulse, a restoration pulse chain is activated after switching of the N refocusing pulses and before the next RF excitation pulse. The restoration pulse chain influences the magnetization such that the magnetization is aligned opposite to the direction of the basic magnetic field by the restoration pulse chain before the next RF excitation pulse.

20 Claims, 5 Drawing Sheets

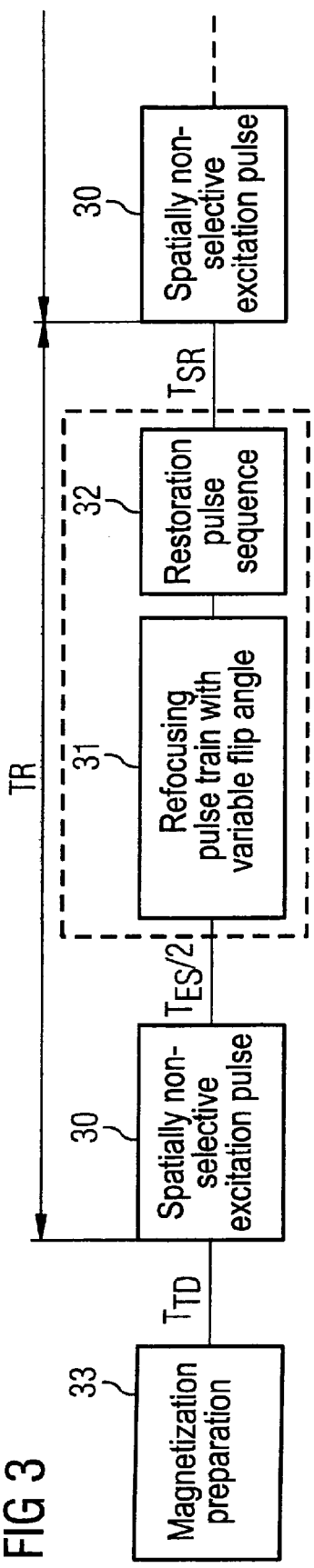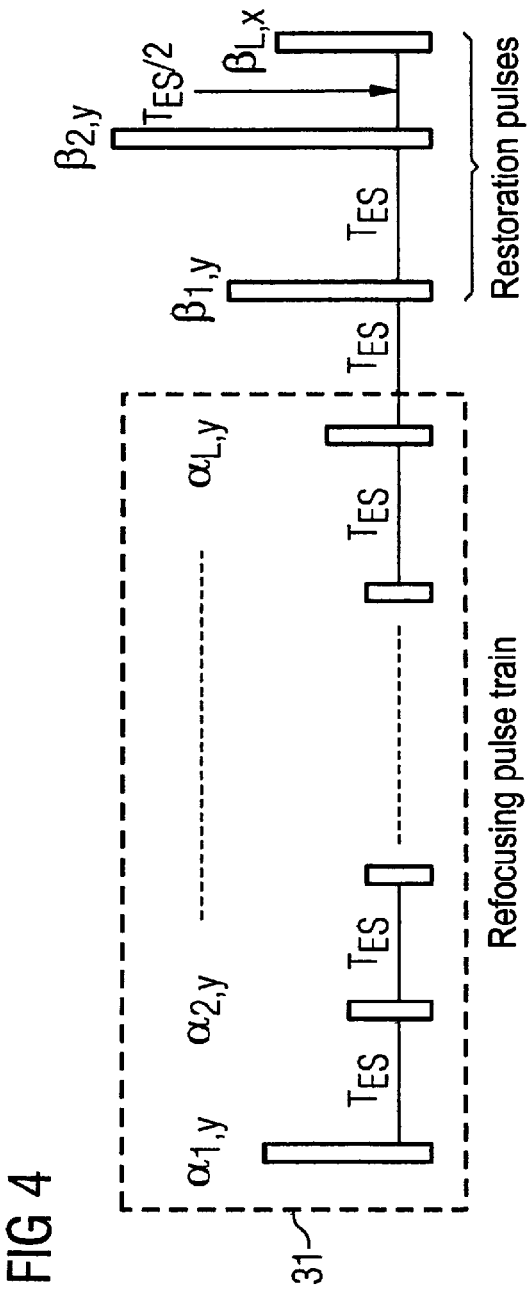
FIG 3
FIG 4

---- GM($\beta_{L,x}$=-90°)   --×-- GM($\beta_{L,x}$= 90°)   —●— WM($\beta_{L,x}$= 0°)
--+-- GM($\beta_{L,x}$= 0°)   —— WM($\beta_{L,x}$=-90°)   —▲— WM($\beta_{L,x}$= 90°)

---- GM with SR   -□- GM without SR
—— WM with SR   -×- WM without SR

TURBOSPIN ECHO IMAGING SEQUENCE WITH LONG ECHO TRAINS AND OPTIMIZED T1 CONTRAST

BACKGROUND OF THE INVENTION

1. Field of the Invention

The present invention concerns a method for generating T1-weighted images of an examination subject by means of magnetic resonance. The invention is particularly suitable in the use of fast spin echo imaging sequences with which a T1 contrast should be achieved. For example, the invention can be used in the acquisition of images of the brain to differentiate between white and grey brain matter. Naturally it can also be applied in other examination regions in which a T1 contrast is desirable.

2. Description of the Prior Art

Two-dimensional spin echo imaging sequences are typically used to achieve a T1 contrast in magnetic resonance images (MR images). However, these sequences have the disadvantage of a long acquisition time. This can be shortened by switching longer echo trains with a number of refocusing pulses. However, given longer echo trains with a number of refocusing pulses the problem arises that the T1 contrast is worsened since the detected signals receive an increased T2 weighting in the course of the echo train.

Furthermore, three-dimensional spin echo imaging methods have been developed in which refocusing pulses with different flip angles have been used after a spatially non-selective excitation pulse, making the use of longer echo trains was possible (see Mugler J P et al. in "Three-dimensional spin-echo-train proton-density-weighted imaging using shaped signal evolutions"; 1999 in Proceedings of the 7th Annual Meeting of ISMRM, Philadelphia, USA, page 1631 and Mugler et al. in "Optimized single-slab three-dimensional spin-echo MR imaging of the brain" in Radiology, 2000; 216(3):891-899). However, these methods furthermore have the disadvantage that the later signal echoes receive a higher T2 weighting given long echo trains.

US 2004/0051527 A1 describes an acquisition method with long echo trains in which the magnetization is inverted before switching the multiple of refocusing pulses with variable flip angle. An associated increasing $T_2$ weighting, however, can also not be prevented with this.

SUMMARY OF THE INVENTION

An object of the present invention is to provide a method to generate T1-weighted images in which the T2 weighting can largely be suppressed in spite of the use of longer echo trains.

This object is achieved according to the invention by a method for generation of T1-weighted images of an examination subject in a magnetic resonance system, wherein, in a first step, the magnetization of the examination subject is excited with an RF excitation pulse. A number N of RF focusing pulses with variable flip angles is subsequently radiated to generate a plurality of spin echoes for an excitation pulse. According to the invention, a restoration pulse chain is now used after switching of the N refocusing pulses, wherein this restoration pulse chain is used before the next RF excitation pulse. This restoration pulse chain of RF pulses influences the magnetization such that the magnetization is aligned opposite to the direction of the basic magnetic field by the restoration pulse chain before the next RF excitation pulse. The basic magnetic field B0 (also called a polarization field) is typically generated so as to be aligned in the positive z-direction. The magnetization is now aligned 180° opposite the basic magnetic field direction before the next RF excitation pulse. The T1 contrast in the calculated image is intensified by this restoration pulse chain or restore pulse chain. A "restoration pulse chain" means to generate a magnetization in the direction of the negative z-axis, so that the inversion of the magnetization does not ensue before the first radiation of an RF excitation pulse and the subsequent refocusing pulses (as is known in the prior art) but rather only after the refocusing pulses. The restoration pulse chain only ensues after the refocusing pulses and not before, due to a prior arranged inversion pulse, as is known in the prior art.

According to a preferred embodiment, the restoration pulse chain is fashioned such that the transverse magnetization is first maximized after the refocusing pulses in order to subsequently align the maximized transversal magnetization counter to the basic magnetic field in the negative z-direction. The restoration pulse chain can be composed of three RF pulses in which the first two RF pulses of the restoration pulse chain maximize the transversal magnetization after the N refocusing pulses while the last RF pulse of this restoration pulse chain aligns the magnetization in the negative z-direction counter to the basic magnetic field. In this exemplary embodiment the two first RF pulses can be radiated along one axis in the transversal plane while the third RF pulse of this pulse chain is essentially radiated orthogonal to the two first pulses. For example, if the first two pulses are radiated along the y-axis, the third pulse is radiated along the x-axis.

The refocusing pulses can have a time interval of $T_{es}$ among one another, wherein the time interval from the last refocusing pulse to the first RF pulse of the restoration pulse chain can likewise be $T_{es}$, and the interval between the first two RF pulses of the restoration pulse chain is likewise essentially equal to $T_{es}$. In one embodiment the time interval between the second RF pulse and the third RF pulse of the restoration pulse chain can be selected half as large, i.e.

$$\frac{T_{es}}{2}.$$

The flip angle of the first two pulses of the restoration pulse chain can be calculated as follows $$\beta_{n,y} = \beta_{max}\cos(\lambda(2-n)), n = 1, 2 \qquad (1)$$

$$\lambda = \cos^{-1}\left(\frac{\alpha_{L,y}}{\beta_{max}}\right)/2, \qquad (2)$$

wherein $\beta_{n,y}$ is the flip angle of the first two restoration pulses and $\beta_{max}$ is the maximum value to determine the flip angle, wherein $\beta_{max}$ can, for example, be selected between 150° and 170° (advantageously 160°) for the calculation and the imaging. $\alpha_{L,y}$ is the flip angle of the last RF pulse in the refocusing pulse train.

The MR images are preferably acquired with a partial Fourier technique (what is known as a half partial Fourier technique). In this acquisition technique the entire raw data space or, respectively, k-space is not filled with signals. According to an embodiment of the invention, this partial Fourier technique can be used with a linear sequence of phase coding lines in the phase coding direction. By the use of the partial Fourier technique, the echo train length is reduced relative to the conventional method with the use of variable refocusing pulses. However, due to the reduction of the echo train length it is possible to minimize the influence of T2-weighted signal portions. For example, the echo length is halved by the partial Fourier technique, whereby the T2 signal influence can be minimized. For example, while between 100 and 120 refocusing pulses with variable flip angle have conventionally been used, according to this embodiment of the invention the number is reduced to a value between 50 and 60.

A further possibility for an optimal image contrast arises when, according to a further aspect of the invention, a saturation segment in which the transversal magnetization is destroyed before the first excitation pulse is used before the first RF excitation pulse of the imaging sequence. This preparation of the magnetization can be achieved via a 90° excitation pulse and the subsequent switching of a gradient to dephase the resulting transversal magnetization. This saturation segment, which can only be switched at the beginning before the first excitation pulse, can contribute to the situation that different signal levels can be avoided during the first excitation pulses. By means of the magnetization preparation, it is possible to acquire an essentially constant signal portion within the first repetition times TR and the associated excitation pulses.

According to an embodiment of the invention, the time interval of the saturation segment before the first excitation pulse (called $T_{TD}$) can be calculated by solving the Bloch equation. $T_{TD}$ can be estimated as follows $$T_{TD} = -T_1 \ln\left(1 - \frac{M_{Z0}}{M_0}\right),\qquad(3)$$

wherein $M_0$ represents the longitudinal equilibrium magnetization and $M_{Z0}$ yields the magnetization at the end of the refocusing pulse train before the start of the next excitation pulse due to the T1 relaxation.

In another embodiment of the invention, important imaging parameters of the imaging sequence are calculated with the use of the Bloch equations. One of these parameters can be the repetition time TR between two excitation pulses. The flip angle of the third RF pulse of the restoration pulse chain can likewise be calculated with the aid of the Bloch equations. The flip angle of the refocusing pulses can also be calculated with the aid of the Bloch equations. According to one embodiment of the invention, the flip angles of the refocusing are varied such that the first RF pulses of this pulse train induces a flip angle between 70° and 90°. This relatively large flip angle is used in order to obtain a pseudo-equilibrium state of the magnetization at the beginning of the echo train. Within a few RF pulses the flip angle is reduced to values between 20° and 30°, wherein the flip angle subsequently rises continuously to values between 40° and 60° up to the N-th RF pulse. A pseudo-equilibrium state is achieved via this flip angle sequence. The aforementioned values relate to imaging sequences for generation of a good image contrast between grey and white brain matter. Naturally other flip angle variations are possible given other application possibilities. The slow rise of the flip angles from values of approximately 20° to values of approximately 50° serves to counter the tissue relaxation processes.

Given an use in the head of an examination person, the flip angle and imaging parameters can be selected such that the signal of the grey brain matter remains essentially constant over the number of refocusing pulses. In one embodiment, the signal curve of the grey brain matter can be determined during the various refocusing pulses, wherein the range (i.e. the number of the refocusing pulses) is subsequently selected in which the grey brain matter begins to have an essentially constant signal curve dependent on refocusing pulses. The first refocusing pulses in which an essentially constant signal curve of the grey brain matter is achieved are used in order to acquire the k-space center at which the signal difference between grey and white brain matter is maximal. Since the k-space center is responsible for the contrast in the image while the outer k-space cells are important for the resolution, the point in time at which the signal difference between white and grey brain matter is greatest is selected for acquisition of the k-space center.

The RF pulses used during the imaging sequence can be pulses of the type known as hard RF pulses that have an essentially rectangular slice profile in the time curve and are radiated without simultaneous switching of gradients. The imaging sequence is advantageously a three-dimensional imaging sequence, wherein the three-dimensionality is achieved not via switching of a plurality of two-dimensional slices in succession but rather via excitation of a volume and via subsequent switching of a further phase coding gradient in addition to the existing phase coding gradients.

BRIEF DESCRIPTION OF THE DRAWINGS

FIG. 3 is a schematic pulse sequence diagram to acquire T1-weighted spin echo-based images according to the invention.

FIG. 4 shows a section from the sequence diagram of FIG. 3 that shows the switching of the refocusing pulses and the restoration pulses.

DESCRIPTION OF THE PREFERRED EMBODIMENTS

Figure 1:
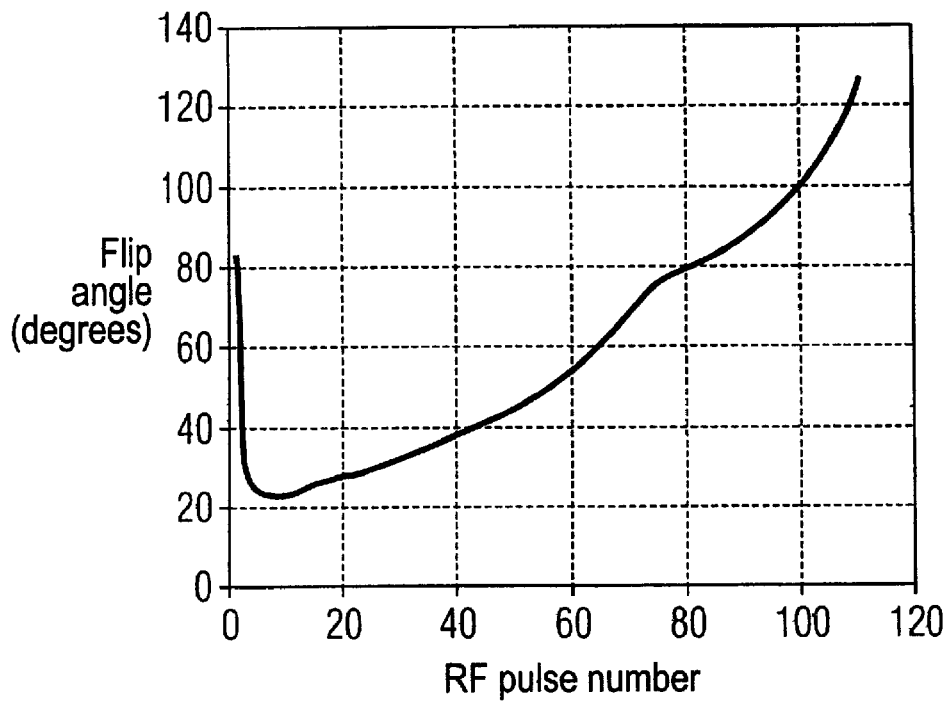
FIG. 1 shows the variation of the flip angles for the refocusing pulses according to a method according to the prior art.
Figure 2:
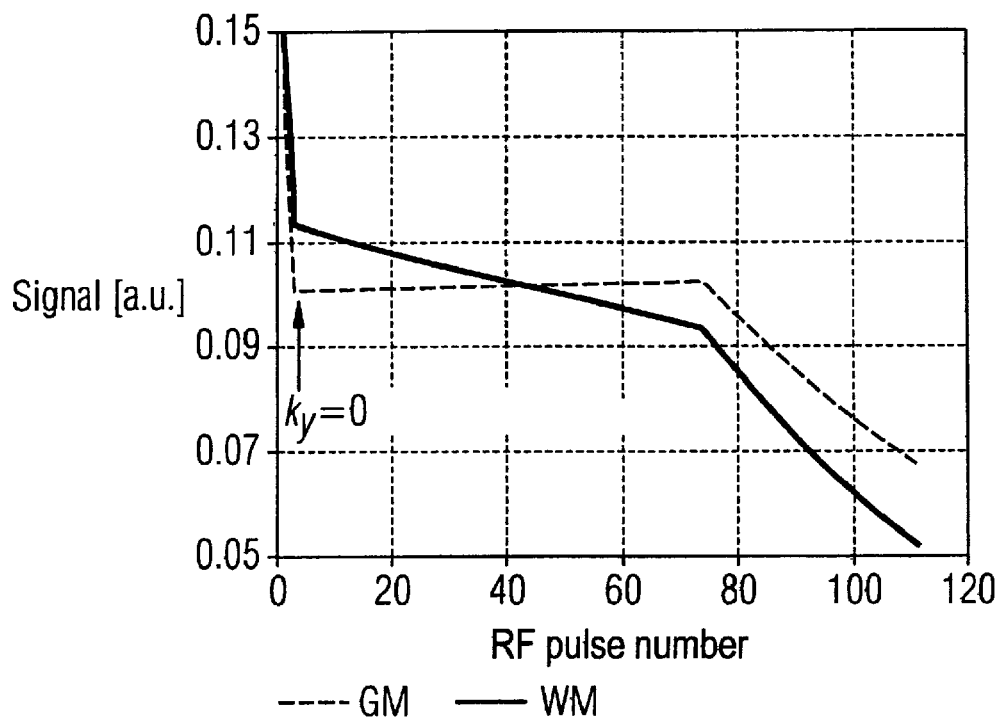
FIG. 2 shows the signal development for the grey and white brain matter for the selection of the refocusing pulses according to the exemplary embodiment of FIG. 1.

The T2 weighting occurring with increasing echo train length in the method according to the prior art is described in more detail in connection with FIGS. 1 and 2. FIG. 1 shows the selection of the flip angles for the refocusing pulses of a turbo spin echo sequence dependent on the number of the RF refocusing pulses. The corresponding signal development in grey and white brain matter for the flip angles used in FIG. 1 is shown in FIG. 2, wherein a T1 contrast should be achieved with the aid of fast spin echo imaging sequences with long echo trains. The signal curve of the grey brain matter (GM) is used as a desired signal value in the Bloch equation to calculate the flip angles of FIG. 1. These simulation parameters were selected as follows: repetition time TR=750 ms, echo time TE=15 ms, interval of the refocusing pulses $T_{es}$=3 ms, echo train length (i.e. number of the refocusing pulses 111) T1/T2=915/100 ms for grey brain matter and T1/T2=600/80 ms for white brain matter. The flip angles vary strongly at the beginning, starting with flip angles over 80°, wherein after fewer than five RF pulses these exhibit a flip angle of 20° to 25°. The flip angle subsequently rises continuously. As can be seen in FIG. 2, a pseudo-equilibrium state for the grey brain matter is achieved after an initial fast, exponential decrease. The white brain matter decreases in signal while the signal of the grey brain matter remains constant. At a given TR, T1-weighted signals are generated at the beginning of the echo train while T2-weighted signals gradually develop in the course of the echo train. For greater RF numbers the signal of the white brain substance intersects the signal of the grey brain matter. The image contrast consequently develops more poorly with increasing number of echoes. The image contrast is dominated by the difference of the signal values between white and grey brain matter at the k-space center point at $K_y$=0. In order to obtain a sufficient T1 contrast, $K_y$=0 is acquired at the beginning when the pseudo-equilibrium state is achieved. This pseudo-equilibrium state is achieved when multiple refocusing pulses are radiated at the beginning of the echo train, as is apparent in FIG. 1. When it is considered that the signal decrease of the white matter occurs faster than that of the grey matter, it is apparent that the image contrast depends on the longitudinal magnetization $M_{Z0}$ that is applied immediately before the excitation pulse as well as on the magnitude of the signal decrease up to the pseudo-equilibrium state. $M_{Z0}$ represents the longitudinal magnetization that appears after the end of the echo train up to the beginning of the excitation pulse due to the T1 relaxation. The magnitude of the signal decrease at the pseudo-equilibrium state decreases when $M_{Z0}$ increases since the signal develops decreasing exponentially. It is consequently important to correctly control the value of $M_{Z0}$ in the white and grey brain matter in order to obtain an increased T1 contrast.

This is achieved with a pulse sequence diagram that is schematically presented in FIGS. 3 and 4. FIG. 3 shows a 3D turbo spin echo pulse diagram with which an optimal T1 contrast can also be achieved with long echo trains. The signal excitation occurs with a spatially non-selective excitation pulse 30 followed by a refocusing pulse train 31 with variable flip angle. As is typical in turbo echo sequences, the signal acquisition respectively occurs between the refocusing pulses after the first refocusing pulse. As is explained later in connection with FIG. 5, a technique known as the partial Fourier technique is applied in which only half of k-space is filled with raw data. Restoration pulses 32 via which the magnetization $M_{Z0}$ is prepared so that an optimal T1 contrast is acquired follow after the refocusing pulse train 31. The refocusing pulse train 31 and the restoration pulses 32 are subsequently explained in detail with reference to FIG. 4. The next spatially non-selective excitation pulse 30 follows after a repetition time TR.

A magnetization preparation 33 (composed of, for example, a 90° pulse and a subsequent spoiler gradient to dephase the arising transverse magnetization) is switched (activated) before the first and only before the first spatially non-selective excitation pulse. The effects of the preceding magnetization preparation are explained in detail in connection with FIG. 10.

Figure 5:
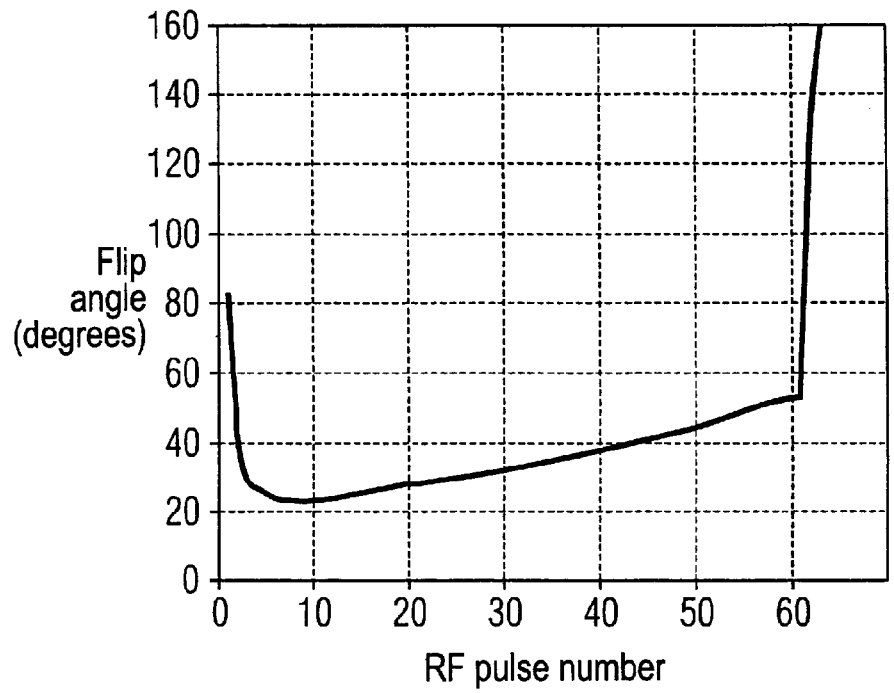
FIG. 5 shows the variation of the flip angles of the refocusing pulses and of the first two RF pulses of the restoration pulse chain.

The refocusing pulses of the refocusing pulse train 31 are presented in detail in FIG. 4. The refocusing pulses consist of N pulses with different flip angles $\alpha_{1,y}$ through $\alpha_{L,y}$. The interval between two refocusing pulses is $T_{es}$. The flip angles for the various refocusing pulses are shown in FIG. 5. The first pulses have an angle of approximately 80° while a flip angle of approximately 20° is achieved between the fifth and tenth pulse. The flip angle then rises continuously until approximately the 60th refocusing pulse. In comparison to FIGS. 1 and 5, it is apparent that the echo train length ETL was reduced by approximately half via the application of the half partial Fourier technique. Restoration pulses 32 (the pulses 32a, 32b and 32c in the shown example) follow after the refocusing pulses in the refocusing pulse train 31. The interval from the last refocusing pulse to the first restoration pulse $\beta_{1,y}$ is likewise $T_{es}$, just like the interval between the first and second restoration pulse. The y- and x-values indicated in FIG. 4 specify the direction of the radiation, wherein the direction of the basic magnetic field extends in the direction of the z-axis. The first two pulses 32a and 32b have the object to refocus (and therefore to maximize) the remaining transversal magnetization after the refocusing pulses in order to intensify the T1 contrast immediately before the next excitation pulse. As is explained in greater detail in connection with FIGS. 6 and 7, the last restoration pulse 32c flips the magnetization in the negative z-direction counter to the direction of the basic magnetic field. As is apparent, all α pulses of the refocusing pulse train and the two first β pulses of the restoration pulse train and the two first β pulses of the restoration pulse train are radiated along one direction (for example the y-direction) while the last restoration pulse 32c is radiated orthogonal to this along the x-direction. Furthermore, the interval between the penultimate and last restoration pulse is only $$\frac{TE}{2}.$$

The flip angles for the first two pulses can be selected as follows:

$$\beta_{n,y} = \beta_{max}\cos(\lambda(2-n)), n = 1, 2 \qquad (4)$$

$$\lambda = \cos^{-1}\left(\frac{\alpha_{L,y}}{\beta_{max}}\right)/2, \qquad (5)$$

wherein $\beta_{n,y}$ is the flip angle of the first two restoration pulses and $\beta_{max}$ is the maximum value of the restoration pulses (which can, for example, be selected as 160°). The angles of the first two restoration pulses are shown in FIG. 5. $\alpha_{L,y}$ is the flip angle of the last RF pulse of the refocusing pulse train that was acquired with the partial Fourier technique. The value of $M_{Z0}$ can be influenced via selection of the flip angle $\beta_{L,x}$ of the last restoration pulse as well as via the time of the signal repetition after the last restoration pulse up to the next excitation pulse, wherein this time span is designated with $T_{sr}$ and is shown in FIG. 3. $M_{Z0}$ can furthermore be influenced by the change of the repetition time TR.

Figure 6:
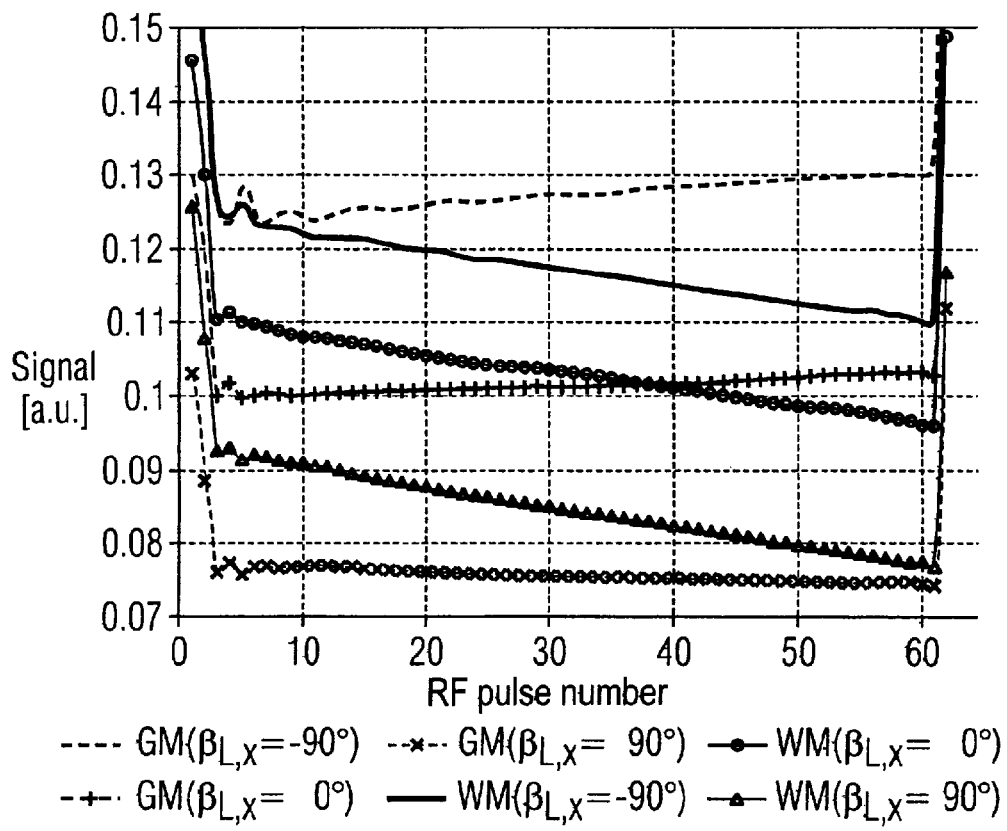
FIG. 6 shows the development of the signal of the white and grey brain matter for various angles of the last RF pulse of the restoration pulse chain dependent on the number of the refocusing pulses.

The T1 contrast of the shown imaging sequence primarily depends on the following imaging parameters: $\beta_{L,x}$, TR and the echo train length ETL. The Bloch equations were numerically simulated to calculate the imaging parameters, for example at 1.5 Tesla with the following repetition times;

T1/T2=950/100 ms for grey brain matter and T1/T2=600/80 ms for white brain matter. The signal development over the number of RF refocusing pulses was examined dependent on the flip angle of the last restoration pulse 33c via calculation of the Bloch equations. A calculation in which three various flip angles of $\beta_{L,x}$ were used is shown by way of example in FIG. 6. A −90° flip angle along the x-axis (i.e. a conventional pulse to flip the transverse magnetization back in the direction of the positive longitudinal axis), 0° flip angle (no pulse) and 90° along the x-axis in which the RF pulse aligns the magnetization relative to the negative longitudinal axis [sic]. The simulation parameters that were used in FIG. 6 were as follows: TR=57 ms, TE=15 ms, $T_{es}$=3 ms, ETL=113 and AETL=60. Furthermore, no magnetization preparation 33 was assumed. The signal development of the white and grey brain matter after approximately 10 TRs is shown in order to be able to study the signal response. This pseudo-equilibrium state for the different flip angles of $\beta_{L,x}$ and for the white and grey brain matter is shown in FIG. 6. Furthermore, the value of the RF pulse is shown in which the k-space center was acquired at $K_y$=0. The signal difference between grey and white brain matter at this point in time is responsible for the image contrast.

The flip angles of the first two restoration pulses were 130° and 160°, as shown in FIG. 5. In FIG. 6 it is now visible that no optimal signal difference between white (WM) and grey (GM) brain matter is achieved with the typically employed pulse of −90° (what is known as a flip back pulse). With the convention flip angle with which the magnetization is again aligned in the positive z-direction there thus exists as good as no signal difference between white and grey brain matter. The signal of the grey brain matter (GM signal) shows a slow rise along the echo train while the signal of the white brain matter decreases relatively significantly. This leads to a signal curve that is not suitable for a T1 contrast. Given application of no pulse, the signal of the white brain matter is greater than the signal of the grey brain matter. Since the signal of the white brain matter decreases more significantly, the two curves intersect after approximately 35 refocusing pulses. In the first half of the echo train the signals are T1-weighted while later they are subjected to the T2 influence. The strongest signal difference is visible given the use of a flip angle that aligns the magnetization counter to the longitudinal magnetization. Due to this large signal difference the two curves also do not intersect, which leads to a T1 weighting along the entire echo train. From the statements with regard to FIG. 6 it can be recognized that the T1 contrast can be optimized via the suitable selection of the restoration pulses with the suitable flip angles.

Figure 7:
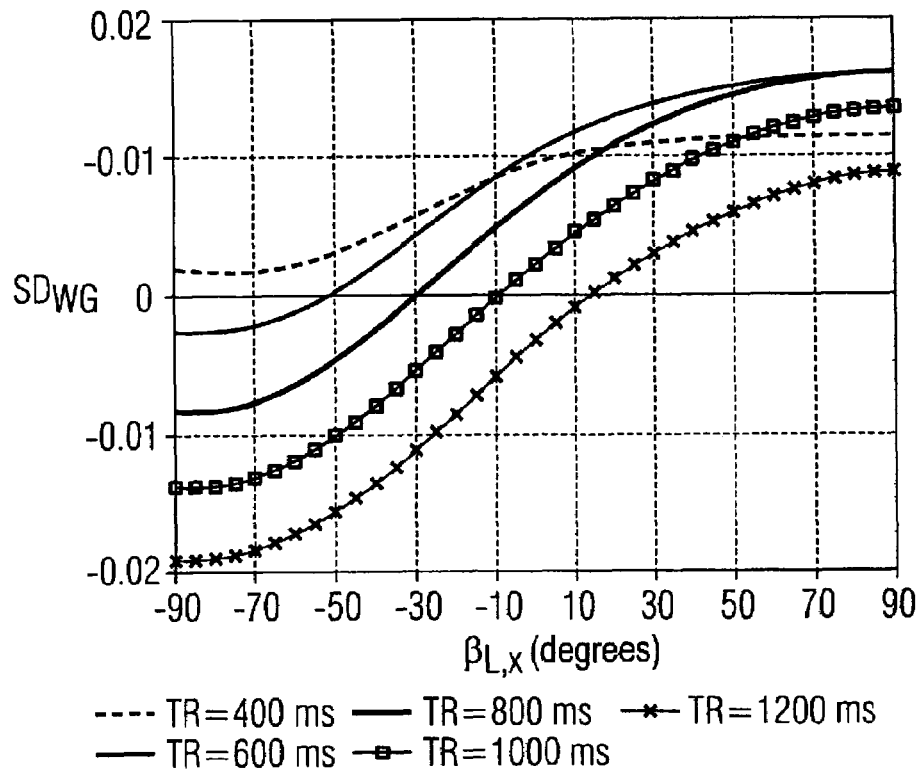
FIG. 7 shows the variation of the signal difference between white brain matter and grey matter at the point in time TE dependent on the flip angle of the last RF pulse of the restoration pulse chain.

FIG. 7 shows the signal difference between white and grey brain matter $SD_{WG}$ at the echo point in time TE with the variation of the last restoration pulse $\beta_{L,x}$. In the shown exemplary embodiment the last restoration pulse varies between −90° and +90°, wherein the repetition times TR were varied between 400 and 1200 ms. If $\beta_{L,x}$ is smaller than −50°, the signal difference is positive at TR=400 ms while it is negative for TR greater than 600 ms. In the event that $\beta_{L,x}$ is greater than 15°, the signal difference for all given TRs is positive, which means that the signal of the white brain matter is greater than that of the grey brain matter. In general it is visible from FIG. 7 that the contrast (i.e. the signal difference) is independent of the selected TR maximum at $\beta_{L,x}$=90°. In summary it can be seen in FIG. 7 that the best contrast can be achieved with a flip angle that that aligns the magnetization along the negative z-direction before the next RF excitation pulse.

Figure 8:
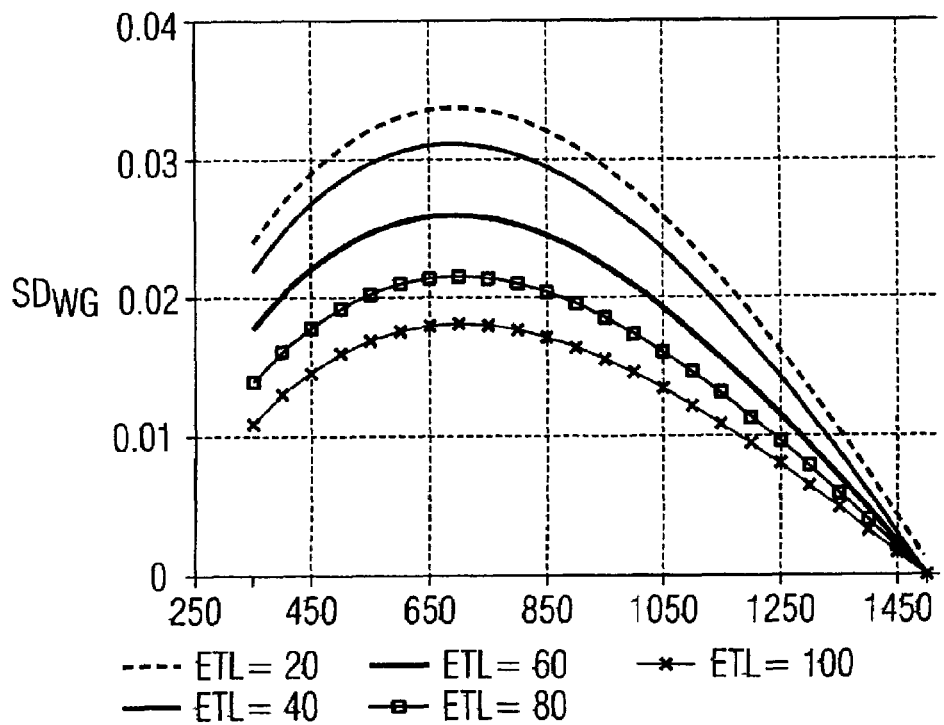
FIG. 8 shows the signal difference between white and grey brain matter at the echo point in time, dependent on the repetition time TR and for various echo pulse lengths.
Figure 9:
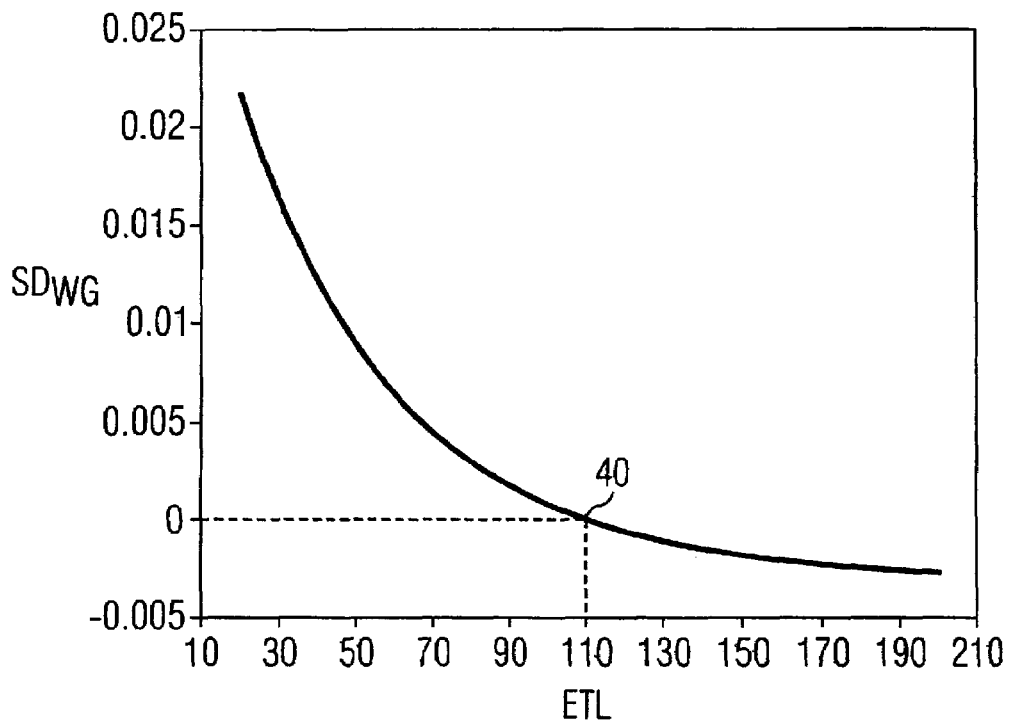
FIG. 9 shows the signal difference between white and grey brain matter dependent on the echo train length.

With the use of at $\beta_{L,x}$=90°, the signal difference is calculated at the point in time TE (shown in FIG. 8) for a repetition time span between 350 and 1500 ms for a refocusing echo train length ETL between 20 and 100. the signal difference at the point in time TE reaches a maximum value for TR between 700 and 800 ms independent of the selected echo train length. In FIG. 9 the signal difference is presented dependent on the echo train length for values between 20 and 200 refocusing pulses (ETL) using the two image parameters at $\beta_{L,x}$ and TR (optimized at 90° and 75° ms). The intersection point of the signal of grey and white brain matter is shown with 40. If ETL is smaller than 110, the signal difference remains positive, which means that the signals are weighted along the entire echo train T1. Given ETL values of greater than 110 the signal difference is negative, which means that the signals are partially T2-weighted in the last part of the echo train. With the partial Fourier technique this means that only 50-60 refocusing pulses are acquired.

Figure 10:
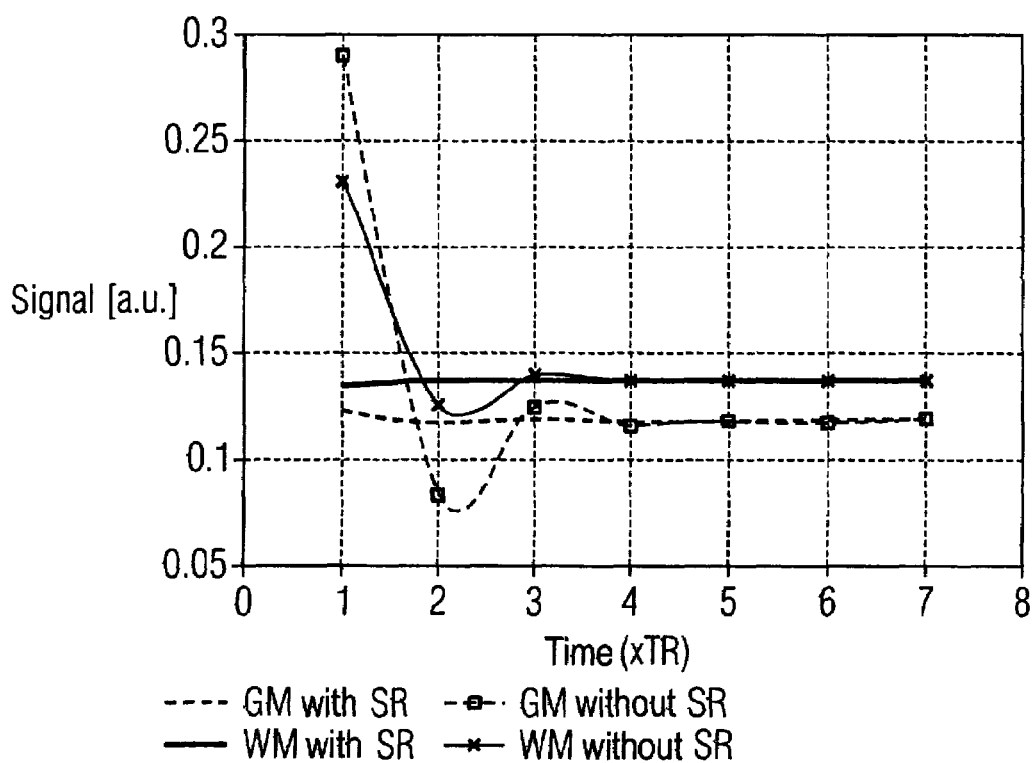
FIG. 10 shows the signal development of the white and grey brain matter at the point in time TE with and without saturation segment before the radiation of the first RF excitation pulse.

In connection with FIG. 10 it can be seen how the signal of the white and grey brain matter at the echo time TE behaves over the first repetition times TR with and without magnetization preparation (designated as SR, for saturation recovery). Signals without saturation pulses fluctuate over the first four TRs and only subsequently reach an equilibrium state while the signals of the white and grey brain matter reach the equilibrium state from the beginning given the use of the magnetization preparation or, respectively, saturation. FIG. 10 shows that the use of Block 33 at the beginning of the imaging is reasonable in order to obtain a constant signal.

It is described below how the flip angle of the refocusing pulse is calculated, which flip angle changes with the number of the switched refocusing pulses (see FIG. 5). Since both the excitation and refocusing pulses are very short, spatially non-selective pulses, the relaxation can be ignored during the application of any one pulse. The radiation of any one pulse thus means a simple rotation around an axis. It is subsequently assumed that the refocusing pulses are radiated along the y-axis. The magnetization $M_x$, $M_y$, $M_z$ directly after the pulse reads as follows:

$$M_y^+ = M_y \quad (6)$$

$$M_x^+ = M_x \cos\alpha - M_z \sin\alpha \quad (7)$$

$$M_z^+ = M_x \sin\alpha + M_z \cos\alpha \quad (8)$$

wherein $M_x$, $M_y$, $M_z$ indicate the magnetizations immediately before the pulse and $\alpha$ is the flip angle of the pulse. With the use of the complex notation $M_{xy}=M_x+ iM_y$ and $M_{xy}^*=M_x-iM_y$, the transversal magnetization vector $M_{xy}^+$ after the pulse can be described as follows $$M_{xy}^+ = M_{xy}\cos^2\frac{\alpha}{2} - M_{xy}^*\sin^2\frac{\alpha}{2} - M_z\sin\alpha, \quad (9)$$

wherein $M_{xy}$ is the transversal magnetization without pulse, $-M_{xy}^*$ is the magnetization after the 180° pulse and $-M_z$ is the magnetization of the longitudinal magnetization with the 90° pulse. In the event that the echo train length ETL and the time interval of the refocusing pulses $T_{ES}$ are known, the refocusing pulse angles can be calculated using tissue-specific signal developments and the relaxation times of the examined tissue. For each pulse the above equation is adapted as follows $$S(n) = A(n)\cos^2\frac{\alpha_n}{2} + B(n)\sin^2\frac{\alpha_n}{2} + C(n)\sin\alpha_n \quad (10)$$

$A_k$ (11)

$$\begin{cases} \frac{1}{N}\sum_{m=1}^{N} T(T_{ES}/2)R_z(\Phi_m)R_y(0°)R_z(\Phi_m)T(T_{ES}/2)R_x(90°)M_i, k = 1 \\ \frac{1}{N}\sum_{M=1}^{N} T(T_{ES}/2)R_z(\Phi_m)R_y(0°)\left[\prod_{n=1}^{k-1}(R_z(\Phi_m)T(T_{ES})R_z(\Phi_m)R_y(\alpha_n))\right] * \\ \qquad R_z(\Phi_m)T(T_{ES}/2)R_x(90°)M_i, k > 1 \end{cases}$$

$B_k$ (12)

$$\begin{cases} \frac{1}{N}\sum_{m=1}^{N} T(T_{ES}/2)R_z(\Phi_m)R_y(180°)R_z(\Phi_m)T(T/_{ES}2)R_x(90°)M_i, k = 1 \\ \frac{1}{N}\sum_{M=1}^{N} T(T_{ES}/2)R_z(\Phi_m)R_y(180°)\left[\prod_{n=1}^{k-1}(R_z(\Phi_m)T(T_{ES})R_z(\Phi_m)R_y(\alpha_n))\right] * \\ \qquad R_z(\Phi_m)T(T_{ES}/2)R_x(90°)M_i, k > 1 \end{cases}$$

$C_k$ (13)

$$\begin{cases} \frac{1}{N}\sum_{m=1}^{N} T(T_{ES}/2)R_z(\Phi_m)R_y(90°)R_z(\Phi_m)T(T/_{ES}2)R_x(90°)M_i, k = 1 \\ \frac{1}{N}\sum_{M=1}^{N} T(T_{ES}/2)R_z(\Phi_m)R_y(90°)\left[\prod_{n=1}^{k-1}(R_z(\Phi_m)T(T_{ES})R_z(\Phi_m)R_y(\alpha_n))\right] *, \\ \qquad R_z(\Phi_m)T(T_{ES}/2)R_x(90°)M_i, k > 1 \end{cases}$$

wherein $A_k$, $B_k$ and $C_k$ respectively correspond to the terms $M_{xy}$, $-M_{xy}^*$ and $-M_z$ in equation (9) and represent the signal that was averaged over isochromates that precess over an angle range between subsequent RF pulses. $M_i$ is the initial magnetization vector $[00\ M_z]^{(T)}$, $R_x$, $R_y$ and $R_z$ are respective rotation matrices around the x-axis (RF excitation pulse), y-axis (refocusing pulse) and z-axis (dephasing due to the applied gradients). $T(\ldots)$ is a matrix operator that represents the T1 and T2 relaxation of the specified times; Z is the matrix $(000; 000; 0001)^T$ which brings the transversal magnetization of the magnetization vector to zero for calculation of the stimulated echo component of the signal; N is the number of the simulated isochromates using the Bloch equations. It is assumed that the applied magnetic field gradients lead to a uniform dephasing of the transversal magnetization between the excitation pulse and the first refocusing pulse and between each refocusing pulse and the subsequent echo. The value of $\phi_m$ is consequently=$360°\cdot(m-1)/N$. Taking into account the Carr-Purcell-Meiboom-Gill condition and the standard gradient configuration for a spin echo pulse train, first echo and the stimulated echoes form at the same time along the y-axis. Equation (10) therefore reduces to a scalar quadratic equation that can be calculated for $A_k$ in closed form.

$$\alpha_k = \cos^{-1}\frac{(A_k - B_k)(2S_k - A_k - B_k) \pm 4C_k\sqrt{C_k^2 - (S_k - B_k)(S_k - A_k)}}{(A_k - B_k)^2 + 4C_k^2} \quad (14)$$

In order to find the described signal development that generates the highest signal level, and so that flip angle conditions can be simply integrated into the solution process, the closed form is combined with an iterative method that is based on the standard interval bisection method (see Mugler et al.: "Practical Implementation of Optimized Tissue-specific Prescribed Signal Evolutions for Improved Turbo-Spin-Echo Imaging", 2003, Proceedings of the 11th Annual Meeting of ISMAM, Toronto, Canada, page 203).

In summary, the present invention enables the generation of pure T1-weighted, three-dimensional turbo spin echo images, wherein the T1 contrast is in particular achieved via the feature of the restoration pulses, the use of the half-Fourier technique and the use of the magnetization preparation. The three employed RF pulses of the restoration pulse sequence increase the residual transversal magnetization and subsequently flips this in the negative z-direction. An intensified T2 weighting is likewise avoided via the use of the half-Fourier technique.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating T1-weighted images of an examination subject by magnetic resonance, in a magnetic resonance apparatus having a basic magnetic field aligned in a basic field direction, comprising the steps of:
   successively exciting respective magnetizations in an examination subject by successively radiating RF excitation pulses;
   after each RF excitation pulse, radiating a plurality N of RF refocusing pulses with respectively different flip angles to generate a plurality of spin echoes for that excitation pulse;
   radiating a restoration pulse chain after radiating said N refocusing pulses and before radiating a next RF excitation pulse, to align the magnetization opposite to the basic field direction before the next RF excitation pulse; and
   after each RF excitation pulse, acquiring magnetic resonance signals from the examination subject and generating a $T_1$-weighted image of the examination subject from said magnetic resonance signals.

2. A method as claimed in claim 1 comprising radiating said restoration pulse chain as a plurality of pulses that maximize a transverse magnetization of the examination subject after said refocusing pulses while said magnetization is subsequently aligned opposite to said basic magnetic field direction.

3. A method as claimed in claim 2 comprising radiating three RF pulses as said restoration pulse chain, with a first two of said three RF pulses maximizing the transverse magnetization after the refocusing pulses and a last of said three RF pulses aligning the magnetization in said direction opposite to said basic magnetic field direction.

4. A method as claimed in claim 3 comprising radiating said first two of said three RF pulses along one axis in a transverse plane of said transverse magnetization, and radiating said last of said three RF pulses substantial orthogonal to said first two of said RF pulses.

5. A method as claimed in claim 3 comprising radiating said N refocusing pulses with a time interval between successive ones of said N refocusing pulses, and radiating said first two of said three RF pulses with the same time interval therebetween.

6. A method as claimed in claim 5 comprising radiating a first of said three RF pulses at the same time interval following a last of said refocusing pulses.

7. A method as claimed in claim 6 comprising radiating said last of said RF pulses at a shorter time interval following a second of said three of said RF pulses, said shorter time interval being equal to one-half of said time interval.

8. A method as claimed in claim 3 wherein said first two of said three RF pulses have a flip angle $\beta_{n,y}$ according to:

$$\beta_{n,y} = \beta_{max}\cos(\lambda(2-n)), n = 1, 2 \quad (1)$$

$$\lambda = \cos^{-1}\left(\frac{\alpha_{L,y}}{\beta_{max}}\right)/2, \quad (2)$$

wherein $\beta_{max}$ is a maximum flip angle and $\alpha_{L,y}$ is the flip angle of a last of said refocusing pulses.

9. A method as claimed in claim 3 comprising electronically calculating a flip angle of a last of said three RF pulses by solving the Bloch equations.

10. A method as claimed in claim 1 comprising generating said magnetic resonance images using a partial Fourier technique by filling substantially only one-half of k-space with raw data represented by said magnetic resonance signals, and only partially acquiring said raw data in a phase coding direction of k-space.

11. A method as claimed in claim 1 comprising selecting N between 40 and 70.

12. A method as claimed in claim 1 comprising selecting N between 50 and 60.

13. A method as claimed in claim 1 comprising implementing a saturation segment before a first of said RF excitation pulses and, in said saturation segment, destroying the magnetization of the examination subject.

14. A method as claimed in claim 13 comprising implementing said saturation segment at a time interval preceding said first of said excitation pulses $T_D$ by solving the Bloch equation:

$$T_{TD} = -T_1 \ln\left(1 - \frac{M_{Z0}}{M_0}\right)$$

wherein $M_0$ represents the longitudinal equilibrium magnetization, among said magnetizations, and $M_{z0}$ represents a magnetization occurring at the end of the refocusing pulse train before the start of a next excitation pulse due to the $T_1$ relaxation.

15. A method as claimed in claim 1 comprising electronically calculating a repetition time between two successive ones of said RF excitation pulses by solving the Bloch equations.

16. A method as claimed in claim 1 comprising varying the respective flip angles of the refocusing pulses to cause a first of said refocusing pulses to have a flip angle between 70° and 90° with the respective flip angles decreasing to values between 20° and 30° within less than 10 of said refocusing pulses, and then continuously increasing the respective flip angles to values between 40° and 60° up to a last of said refocusing pulses.

17. A method as claimed in claim 1 comprising exciting brain tissue of the examination subject with said RF excitation pulses, and generating said T-1 weighted image as an image of the brain of the examination subject with a contrast between grey matter and white matter in the brain.

18. A method as claimed in claim 16 comprising obtaining a signal curve originating from said grey matter during said N refocusing pulses and identifying in which of said refocusing pulses said signal curve is substantially dependent on said refocusing pulses, and entering said magnetic resonance signals into k-space with a center of k-space defined by a refocusing pulse in which a signal difference between said grey matter and said white matter is maximum.

19. A method as claimed in claim 1 comprising acquiring said magnetic resonance signals with a three-dimensional imaging sequence comprising two-phase coding gradients in two different spatial directions.

20. A method as claimed in claim 1 comprising radiating said RF excitation pulses and said RF refocusing pulses each with a substantially rectangular pulse profile relative to time, and without activation of a gradient magnetic field.

* * * * *